US012662405B2

(12) United States Patent
Park et al.

(10) Patent No.: US 12,662,405 B2
(45) Date of Patent: Jun. 23, 2026

(54) ULTRAPURE WATER PRODUCTION SYSTEM, SEMICONDUCTOR PROCESSING SYSTEM INCLUDING THE SAME, AND SEMICONDUCTOR FABRICATION METHOD USING THE SAME

(71) Applicant: Samsung Electronics Co., Ltd., Suwon-si (KR)

(72) Inventors: Juhui Park, Suwon-si (KR); Jongha Yun, Suwon-si (KR); Younhaeng Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 129 days.

(21) Appl. No.: 18/475,898

(22) Filed: Sep. 27, 2023

(65) Prior Publication Data

US 2024/0317622 A1 Sep. 26, 2024

(30) Foreign Application Priority Data

Mar. 21, 2023 (KR) ........................ 10-2023-0036583

(51) Int. Cl.
*C02F 9/00* (2023.01)
*H10P 50/64* (2026.01)
(Continued)

(52) U.S. Cl.
CPC .............. *C02F 9/00* (2013.01); *H10P 50/642* (2026.01); *H10P 52/402* (2026.01); *H10P 70/00* (2026.01);
(Continued)

(58) Field of Classification Search
CPC .... C02F 9/00; C02F 1/20; C02F 1/283; C02F 1/325; C02F 1/42; C02F 2001/422;
(Continued)

(56) References Cited

U.S. PATENT DOCUMENTS 7,033,481 B1 4/2006 Schlager et al.
8,480,906 B2 7/2013 Kobayashi
(Continued)

FOREIGN PATENT DOCUMENTS

KR 100462897 B1 12/2004
WO WO-2021/025991 A1 2/2021

*Primary Examiner* — Xiuyu Tai
(74) *Attorney, Agent, or Firm* — HARNESS, DICKEY & PIERCE, P.L.C.

(57) ABSTRACT

Disclosed are ultrapure water production systems, semiconductor processing systems, and semiconductor fabrication methods. An ultrapure water production system may include a front filtering part that filters a fluid and a rear filtering part that filters the fluid released from the front filtering part. The rear filtering part may include a UV irradiator that irradiates a UV ray to the fluid to remove an organic material from the fluid, an ANP that removes hydrogen peroxide from the fluid released from the UV irradiator, a connection line that connects the UV irradiator to the ANP, a hydrogen peroxide detector that is on the connection line and detects a concentration of hydrogen peroxide in the fluid released from the UV irradiator, and a DO detector between the hydrogen peroxide detector and the ANP to measure a concentration of dissolved oxygen in the fluid released from the UV irradiator.

19 Claims, 14 Drawing Sheets

(51) Int. Cl.

| | |
|---|---|
| *H10P 52/40* | (2026.01) |
| *H10P 70/00* | (2026.01) |
| *C02F 1/20* | (2023.01) |
| *C02F 1/28* | (2023.01) |
| *C02F 1/32* | (2023.01) |
| *C02F 1/42* | (2023.01) |
| *C02F 101/10* | (2006.01) |
| *C02F 101/30* | (2006.01) |
| *C02F 103/04* | (2006.01) |
| *C02F 103/34* | (2006.01) |

(52) U.S. Cl.
CPC ................ *C02F 1/20* (2013.01); *C02F 1/283* (2013.01); *C02F 1/325* (2013.01); *C02F 1/42* (2013.01); *C02F 2001/422* (2013.01); *C02F 2101/10* (2013.01); *C02F 2101/30* (2013.01); *C02F 2103/04* (2013.01); *C02F 2103/346* (2013.01); *C02F 2201/326* (2013.01); *C02F 2209/20* (2013.01); *C02F 2209/22* (2013.01)

(58) Field of Classification Search
CPC .............. C02F 2101/10; C02F 2101/30; C02F 2103/04; C02F 2103/346; C02F 2201/326; C02F 2209/20; C02F 2209/22; C02F 1/008; C02F 1/441; C02F 1/00; C02F 1/32; C02F 1/44; C02F 2209/001; C02F 1/725; C02F 1/58; C02F 1/70; C02F 1/4695; C02F 1/469; C02F 2305/023; H01L 21/02041; H01L 21/30604; H01L 21/30625; G01N 33/18; G01N 1/40; G01N 31/10; B01D 61/463; B01D 19/0073; B01D 2311/2619; B01D 61/145; B01D 2311/2626; B01D 2311/04; B01D 61/025; B01D 61/485; B01D 61/58; B01D 19/0084; B01D 65/00; B01D 61/10
See application file for complete search history.

(56) References Cited

U.S. PATENT DOCUMENTS

| | | | |
|---|---|---|---|
| 2016/0185625 A1* | 6/2016 | Liu ..................... | B01D 17/045 |
| | | | 210/693 |
| 2021/0181167 A1 | 6/2021 | Sundstrom | |
| 2022/0267174 A1 | 8/2022 | Foster et al. | |
| 2024/0150200 A1* | 5/2024 | Sasaki ................... | B01D 61/44 |
| 2024/0239695 A1* | 7/2024 | Sasaki ................. | B01D 61/463 |

* cited by examiner

FIG. 10

ULTRAPURE WATER PRODUCTION SYSTEM, SEMICONDUCTOR PROCESSING SYSTEM INCLUDING THE SAME, AND SEMICONDUCTOR FABRICATION METHOD USING THE SAME

CROSS-REFERENCE TO RELATED APPLICATION

This U.S. nonprovisional application claims priority under 35 U.S.C § 119 to Korean Patent Application No. 10-2023-0036583, filed on Mar. 21, 2023 in the Korean Intellectual Property Office, the disclosure of which is hereby incorporated by reference in its entirety.

BACKGROUND

Inventive concepts relate to an ultrapure water production system, a semiconductor processing system including the same, and a semiconductor fabrication method using the same, and more particularly, to an ultrapure water production system capable of controlling a concentration of hydrogen peroxide, a semiconductor processing system including the same, and a semiconductor fabrication method using the same.

A semiconductor device may be fabricated by using various processes. For example, a semiconductor device may be manufactured by allowing a silicon wafer to undergo a photolithography process, an etching process, a deposition process, and so forth. Various fluids may be used in such processes. For example, ultrapure water (UPW) may be used in a polishing process. Various kinds of filters may be utilized to produce the ultrapure water.

SUMMARY

Some embodiments of inventive concepts provide an ultrapure water production system capable of flexibly controlling a concentration of hydrogen peroxide, a semiconductor processing system including the same, and a semiconductor fabrication method using the same.

Some embodiments of inventive concepts provide an ultrapure water production system capable of increasing a lifetime of ANP (anion polisher), a semiconductor processing system including the same, and a semiconductor fabrication method using the same.

Some embodiments of inventive concepts provide an ultrapure water production system capable of limiting and/or preventing damage to a substrate, a semiconductor processing system including the same, and a semiconductor fabrication method using the same.

Aspects of inventive concepts are not limited to those mentioned above, and other aspects which have not been mentioned above will be clearly understood to those skilled in the art from the following description.

According to some embodiments of inventive concepts, an ultrapure water production system may include a front filtering part configured to filter a fluid; and a rear filtering part configured to filter the fluid after the fluid is released from the front filtering part. The rear filtering part may include an ultraviolet (UV) irradiator configured to irradiate a UV ray onto the fluid to remove an organic material from the fluid; an anion polisher (ANP) configured to remove hydrogen peroxide from the fluid after the fluid is released from the UV irradiator; a connection line that connects the UV irradiator to the ANP, the connection line being in fluid communication with UV irradiator and the ANP; a hydrogen peroxide detector on the connection line and configured to detect a concentration of hydrogen peroxide in the fluid after the fluid is released from the UV irradiator; and a dissolved oxygen (DO) detector between the hydrogen peroxide detector and the ANP, the DO detector being configured to measures a concentration of dissolved oxygen in the fluid after the fluid is released from the UV irradiator.

According to some embodiments of inventive concepts, a semiconductor processing system may include an ultrapure water production system configured to produce ultrapure water; and a substrate processing apparatus arranged to be supplied with the ultrapure water from the ultrapure water production system, the substrate processing apparatus configured to perform a process on a substrate. The ultrapure water production system may include a front filtering part configured to filter a fluid and a rear filtering part configured to filter the fluid after the fluid is released from the front filtering part. The rear filtering part may include an ultraviolet (UV) irradiator configured to irradiate a UV ray onto the fluid to remove an organic material from the fluid, an anion polisher (ANP) configured to remove hydrogen peroxide from the fluid after the fluid is released from the UV irradiator; and a hydrogen peroxide detector between the UV irradiator and the ANP.

According to some embodiments of inventive concepts, a semiconductor fabrication method may include producing ultrapure water using an ultrapure water production system; and performing a process on a substrate using the ultrapure water. The ultrapure water production system may include an ultraviolet (UV) irradiator, an anion polisher (ANP) configured to remove hydrogen peroxide from a fluid released from the UV irradiator, and a hydrogen peroxide detector between the UV irradiator and the ANP. The producing the ultrapure water may include using the hydrogen peroxide detector to measure a concentration of hydrogen peroxide in the fluid released from the UV irradiator, controlling the UV irradiator based on information about the concentration of hydrogen peroxide measured by the hydrogen peroxide detector; and using the ANP to remove hydrogen peroxide from the fluid released from the UV irradiator.

Details of example embodiments are included in the description and drawings.

BRIEF DESCRIPTION OF DRAWINGS

FIGS. 9 to 14 illustrate diagrams showing a semiconductor fabrication method according to the flow chart of FIG. 8.

DETAILED DESCRIPTION OF EMBODIMENTS

Figure 1:
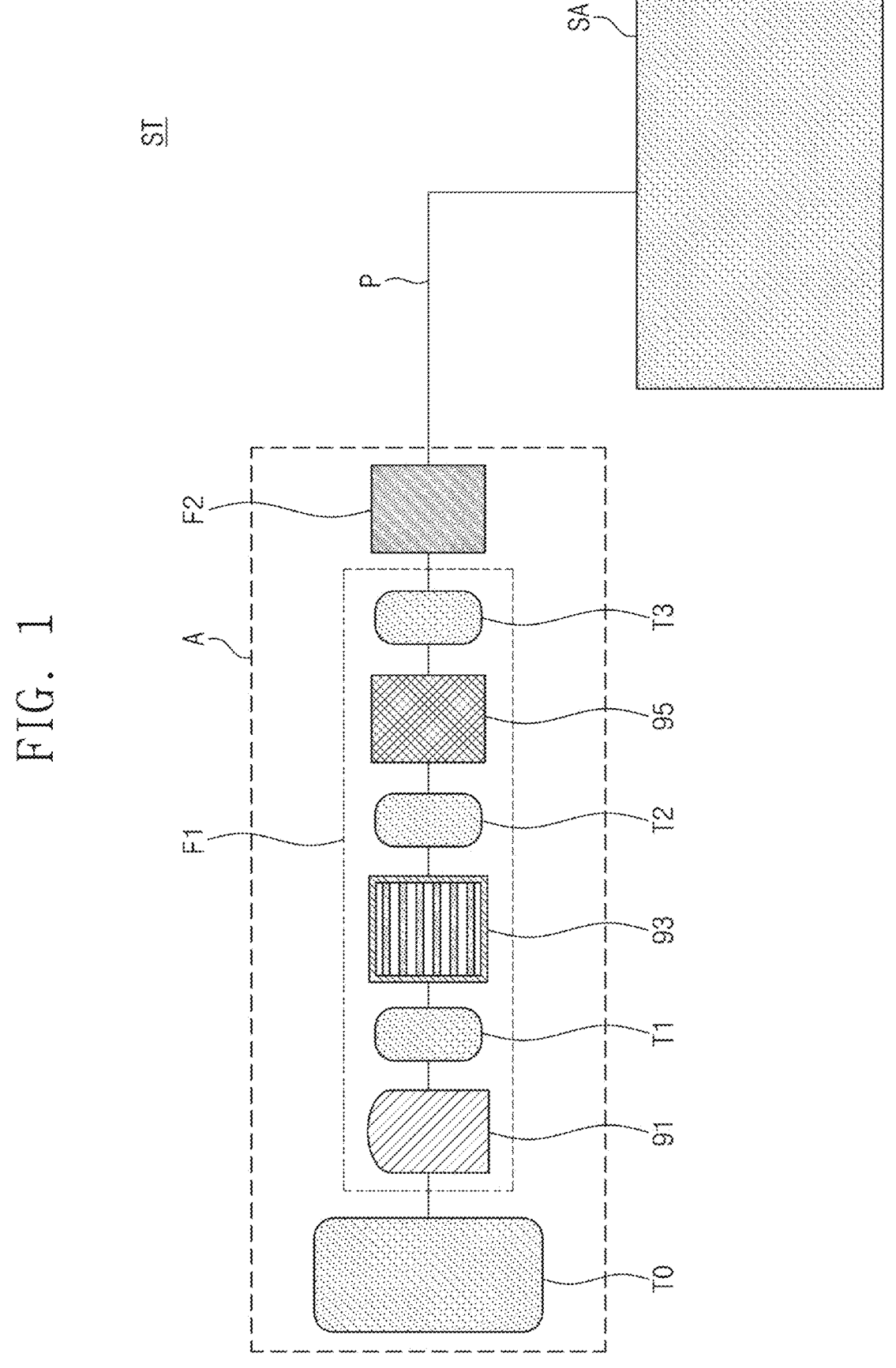
FIG. 1 illustrates a simplified schematic diagram showing a semiconductor processing system according to some embodiments of inventive concepts.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes. When ranges are specified, the range includes all values therebetween such as increments of 0.1%.

The following will now describe some embodiments of inventive concepts with reference to the accompanying drawings. Like reference numerals may indicate like components throughout the description.

FIG. 1 illustrates a simplified schematic diagram showing a semiconductor processing system according to some embodiments of inventive concepts.

Referring to FIG. 1, a semiconductor processing system ST may be provided. The semiconductor processing system ST may perform on a substrate a process to fabricate a semiconductor device. For example, the semiconductor processing system ST may be configured to perform on the substrate a cleaning process, an etching process, and/or a polishing process. The substrate may be a silicon (Si) wafer, but inventive concepts are not limited thereto. Ultrapure water (UPW) may be used in a process performed on the substrate. The semiconductor processing system ST may include an ultrapure water production system A, a substrate processing apparatus SA, and a supply line P.

The ultrapure water production system A may produce and supply the ultrapure water (UPW). The ultrapure water may indicate water with high electrical conductivity and less impurities. The ultrapure water production system A may be connected to the substrate processing apparatus SA. The ultrapure water production system A may produce the ultrapure water and may supply the substrate processing apparatus SA with the ultrapure water. The ultrapure water production system A may include a water supply tank TO, a front filtering part F1, and a rear filtering part F2.

The water supply tank TO may supply the front filtering part F1 with water. For example, the water supply tank TO may temporarily store water and may supply the front filtering part F1 with the water.

The front filtering part F1 may primarily filter the water. The front filtering part F1 may include a first filter 91, a first tank T1, a second filter 93, a second tank T2, a third filter 95, and a third tank T3. The first filter 91, the first tank T1, the second filter 93, the second tank T2, the third filter 95, and the third tank T3 may be arranged in series. Each of the first, second, and third filters 91, 93, and 95 may include one of an active carbon filter, an ion exchange resin device, a reverse osmotic membrane device, a hollow fiber membrane device, and an ultraviolet (UV) irradiator. For example, the second filter 93 may include a UV irradiator. In this case, the second filter 93 may be called a front UV irradiator. The front UV irradiator may irradiate a UV ray to a fluid. The front UV irradiator may provide the fluid with the UV ray whose wavelength is in a range of about 240 nm to about 270 nm. For example, the front UV irradiator may provide the fluid with the UV ray whose wavelength is in a range of about 254 nm to about 270 nm. Inventive concepts, however, are not limited thereto. When the fluid passes through the front UV irradiator, microbes may be removed from the fluid. The front filtering part F1 may include a vacuum degassing device (e.g., pump for providing vacuum) in fluid communication with one of the first to third tanks T1 to T3.

The rear filtering part F2 may filter the fluid that has passed through (e.g., released from) the front filtering part F1. The rear filtering part F2 will be further discussed in detail below.

The substrate processing apparatus SA may perform a process on the substrate. For example, the substrate processing apparatus SA may be configured to perform on the substrate a cleaning process, an etching process, and/or a polishing process. The substrate processing apparatus SA may be a cleaning apparatus, etching apparatus (e.g., plasma etcher or wet etch apparatus), and/or a polishing apparatus (e.g., CMP apparatus). The ultrapure water may be needed to allow the substrate processing apparatus SA to perform a process on the substrate. The substrate processing apparatus SA may be supplied with the ultrapure water from the ultrapure water production system A. The substrate processing apparatus SA will be further discussed in detail with reference to FIGS. 6 and 7.

The supply line P may connect the ultrapure water production system A to the substrate processing apparatus SA. The ultrapure water produced from the ultrapure water production system A may be supplied through the supply line P to the substrate processing apparatus SA.

Figure 2:
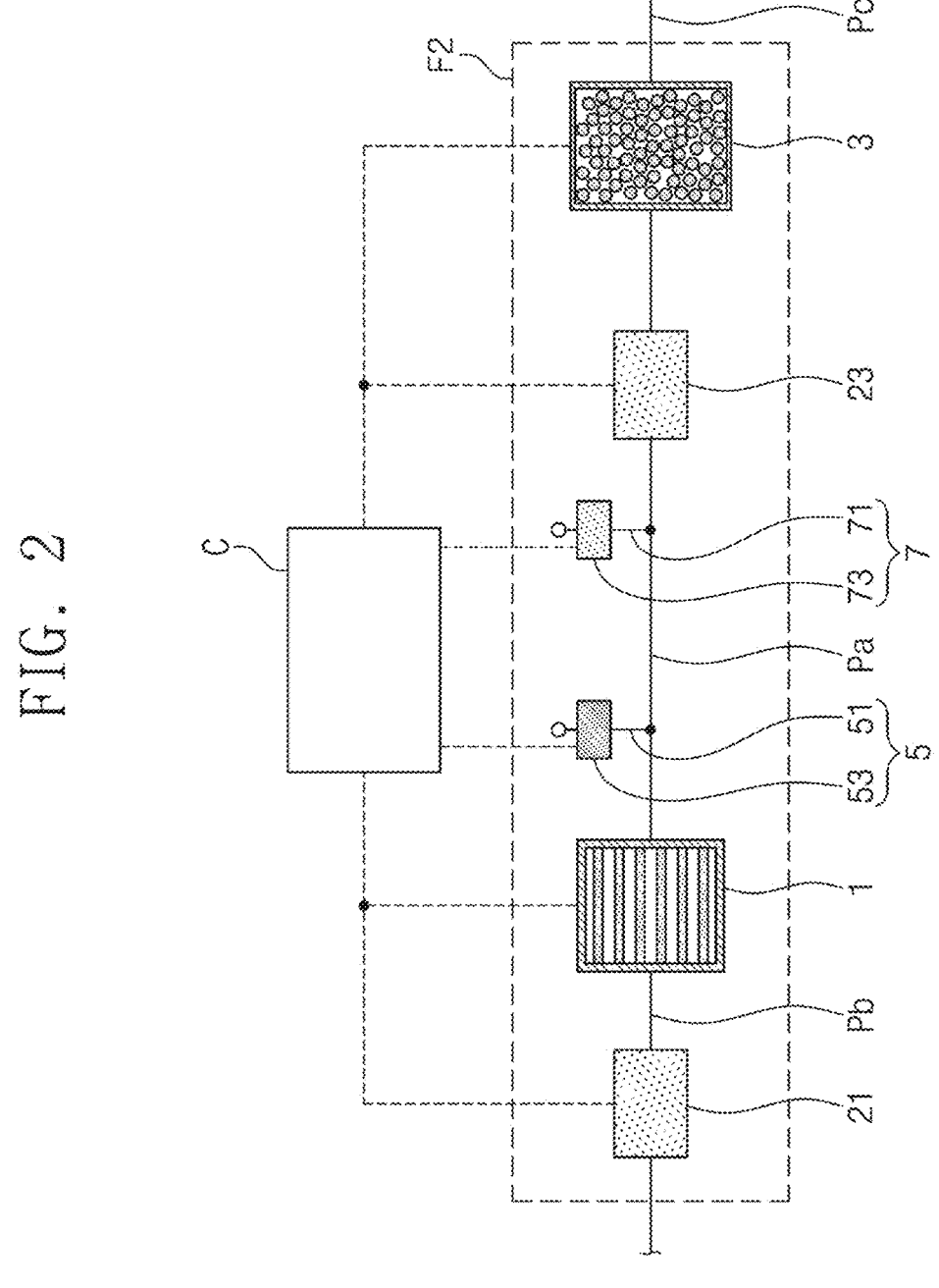
FIG. 2 illustrates a simplified schematic diagram partially showing an ultrapure water production system according to some embodiments of inventive concepts.

FIG. 2 illustrates a simplified schematic diagram partially showing an ultrapure water production system according to some embodiments of inventive concepts.

Referring to FIG. 2, the rear filtering part F2 may include a first total organic carbon (TOC) analyzer 21, an ultraviolet (UV) irradiator 1, a first line Pb, an anion polisher (ANP) 3, a connection line Pa, a hydrogen peroxide detector 5, a dissolved oxygen (DO) detector 7, a second total organic carbon (TOC) analyzer 23, and a second line Pc. The first TOC analyzer 21, the UV irradiator 1, the first line Pb, the ANP 3, the connection line Pa, the hydrogen peroxide detector 5, the DO detector 7, the second TOC analyzer 23, and the second line Pc may be connected in series, but inventive concepts are not limited thereto.

The first TOC analyzer 21 may measure a concentration of total organic carbon in the fluid. For example, the first TOC analyzer 21 may use high temperature thermal oxidation to measure the concentration of total organic carbon in the fluid. The first TOC analyzer 21 may include a burner, an infrared detection sensor, and/or a catalyst. Alternatively, the first TOC analyzer 21 may use UV-persulfate oxidation to measure the concentration of total organic carbon in the fluid. In this case, the first TOC analyzer 21 may include a UV lamp and/or persulfate. Inventive concepts, however, are not limited thereto, and the first TOC analyzer 21 may include other components for measuring the concentration of total organic carbon in the fluid. The first TOC analyzer 21 may be positioned between the front filtering part (see F1 of FIG. 1) and the UV irradiator 1. Therefore, the first TOC analyzer 21 may measure the concentration of total organic carbon in the fluid before the UV irradiator 1 receives the fluid that has passed through the front filtering part F1. A controller C may be provided with information about the concentration of total organic carbon in the fluid, which concentration is measured by the first TOC analyzer 21.

The UV irradiator 1 may irradiate a UV ray to the fluid. When the fluid passes through the UV irradiator 1, microbes may be removed from the fluid. When the fluid passes through the UV irradiator 1, the fluid may be irradiated with the UV ray whose wavelength is in a range of about 180 nm to about 190 nm. For example, when the fluid passes through the UV irradiator 1, the fluid may be irradiated with the UV ray whose wavelength is about 185 nm. When the UV ray is irradiated to the fluid, microbes in the fluid may be decomposed. In this procedure, hydrogen peroxide ($H_2O_2$) may be produced. The UV irradiator 1 may irradiate the UV ray in accordance with control of the controller C. The UV irradiator 1 will be further discussed in detail below.

The first line Pb may connect the first TOC analyzer 21 to the UV irradiator 1. The fluid may move from the first TOC analyzer 21 through the first line Pb to the UV irradiator 1.

The ANP 3 may remove hydrogen peroxide from the fluid. For example, the ANP 3 may use sulfur trioxide ($SO_3$) to decompose hydrogen peroxide. There may thus be a reduction in concentration of hydrogen peroxide in the fluid. The ANP 3 will be further discussed in detail below.

The connection line Pa may connect the UV irradiator 1 to the ANP 3. The fluid that has passed through the UV irradiator 1 may move through the connection line Pa to the ANP 3.

The hydrogen peroxide detector 5 may be positioned on the connection line Pa. The hydrogen peroxide detector 5 may detect a concentration of hydrogen peroxide in the fluid that moves along the connection line Pa. The hydrogen peroxide detector 5 may include a first detection line 51 and a hydrogen peroxide sensor 53. The first detection line 51 may be branched from the connection line Pa. The hydrogen peroxide sensor 53 may be connected to an end of the first detection line 51. The hydrogen peroxide sensor 53 may detect the concentration of hydrogen peroxide in the fluid that is discharged from the connection line Pa to the first detection line 51. The hydrogen peroxide sensor 53 may use an electrochemical oxidation reaction to measure the concentration of hydrogen peroxide. The hydrogen peroxide sensor 53 may include an anode, a cathode, and/or a porous polymer layer. Inventive concepts, however, are not limited thereto, and the hydrogen peroxide sensor 53 may use another method to measure the concentration of hydrogen peroxide in the fluid.

The DO detector 7 may be positioned on the connection line Pa. The DO detector 7 may detect a concentration of dissolved oxygen (DO) in the fluid that moves along the connection line Pa. The DO detector 7 may include a second detection line 71 and a dissolved oxygen (DO) sensor 73. The second detection line 71 may be branched from the connection line Pa. The DO sensor 73 may be connected to an end of the second detection line 71. The DO sensor 73 may detect the concentration of dissolved oxygen in the fluid that is discharged from the connection line Pa to the second detection line 71. The DO sensor 73 may use an electrochemical reaction to measure the concentration of dissolved oxygen in the fluid. The DO sensor 73 may include a galvanic electrode or a polarographic electrode. Alternatively, the DO sensor 73 may use an optical measurement method to measure the concentration of dissolved oxygen in the fluid. In this case, the DO sensor 73 may include a light emitting diode. Inventive concepts, however, are not limited thereto, and the DO sensor 73 may use another method to measure the concentration of dissolved oxygen in the fluid.

The second TOC analyzer 23 may measure the concentration of total organic carbon in the fluid. For example, the second TOC analyzer 23 may use high temperature thermal oxidation to measure the concentration of total organic carbon in the fluid. The second TOC analyzer 23 may include a burner, an infrared detection sensor, and/or a catalyst. Alternatively, the second TOC analyzer 23 may use UV-persulfate oxidation to measure the concentration of total organic carbon in the fluid. In this case, the second TOC analyzer 23 may include a UV lamp and/or persulfate. Inventive concepts, however, are not limited thereto, and the second TOC analyzer 23 may include other components for measuring the concentration of total organic carbon in the fluid. The second TOC analyzer 23 may be positioned between the UV irradiator 1 and the ANP 3. Therefore, the second TOC analyzer 23 may measure the concentration of total organic carbon in fluid before the ANP 3 receives the fluid that has passed through the UV irradiator 1. The controller C may be provided with information about the concentration of total organic carbon in the fluid, which concentration is measured by the second TOC analyzer 23.

The second line Pc may connect the ANP 3 to the substrate processing apparatus (see SA of FIG. 1). The fluid may move from the ANP 3 through the second line Pc to the substrate processing apparatus SA.

Figure 3:
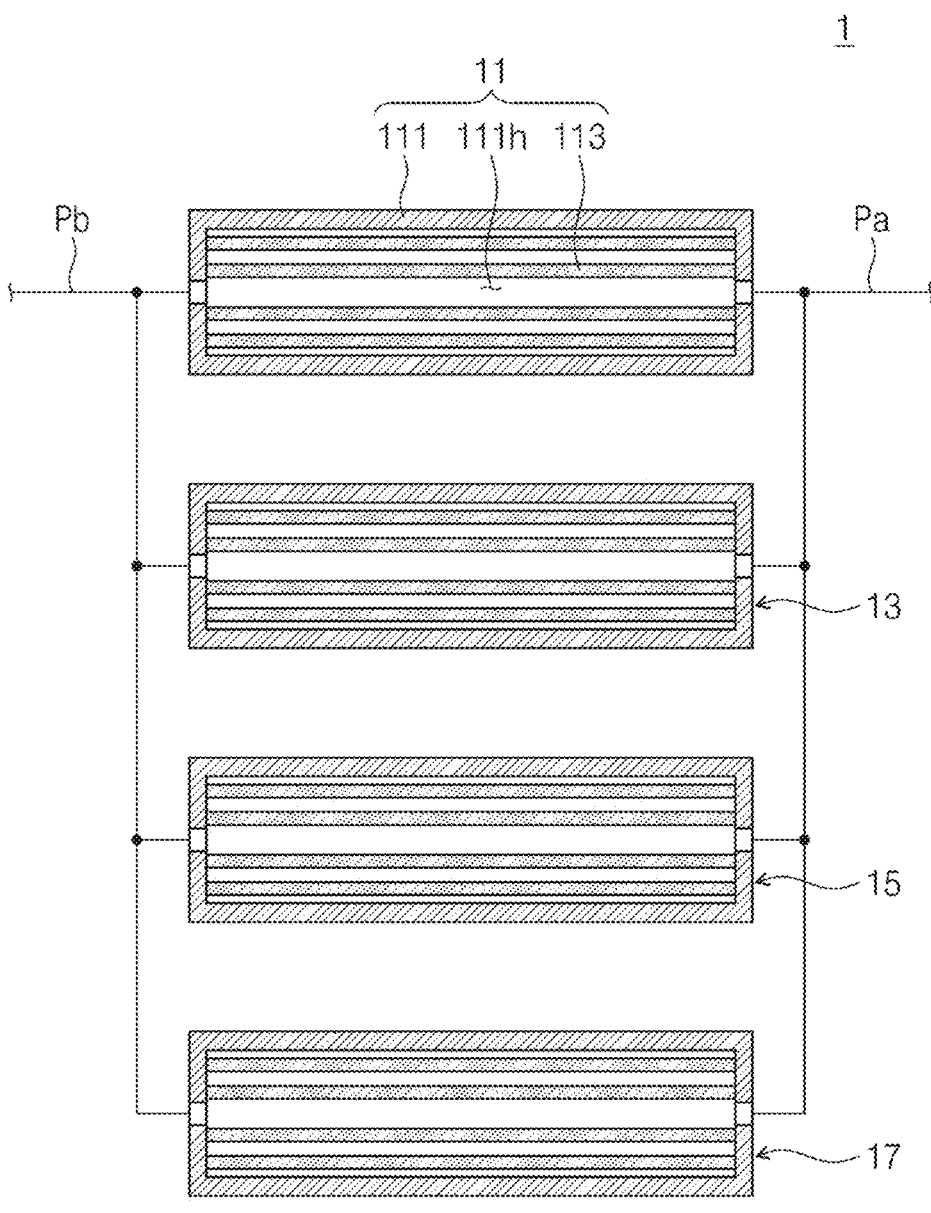
FIG. 3 illustrates a cross-sectional view showing an ultraviolet (UV) irradiator according to some embodiments of inventive concepts.

FIG. 3 illustrates a cross-sectional view showing an ultraviolet (UV) irradiator according to some embodiments of inventive concepts.

Referring to FIG. 3, the UV irradiator 1 may be provided in plural. For example, as shown in FIG. 3, four UV irradiators 1 may be provided. The four UV irradiators 1 may include a first UV irradiator 11, a second UV irradiator 13, a third UV irradiator 15, and a fourth UV irradiator 17. The first UV irradiator 11, the second UV irradiator 13, the third UV irradiator 15, and the fourth UV irradiator 17 may be disposed in parallel. For example, the first UV irradiator 11, the second UV irradiator 13, the third UV irradiator 15, and the fourth UV irradiator 17 may be connected in parallel between and to the first line Pb and the connection line Pa.

The first UV irradiator 11 may include a UV tank 111 and a UV lamp 113. The UV tank 111 may provide a UV irradiation space 111h. The UV irradiation space 111h may be connected to each of the first line Pb and the connection line Pa. The UV lamp 113 may be positioned in the UV irradiation space 111h. The UV lamp 113 may irradiate a UV ray whose wavelength is in a range of about 180 nm to about 190 nm. The UV lamp 113 may be provided in plural. The plurality of UV lamps 113 may be disposed spaced apart from each other in a direction that intersects a flowing direction of the fluid. Each of the second UV irradiator 13, the third UV irradiator 15, and the fourth UV irradiator 17 may be configured substantially identically or similarly to the first UV irradiator 11.

Figure 4:
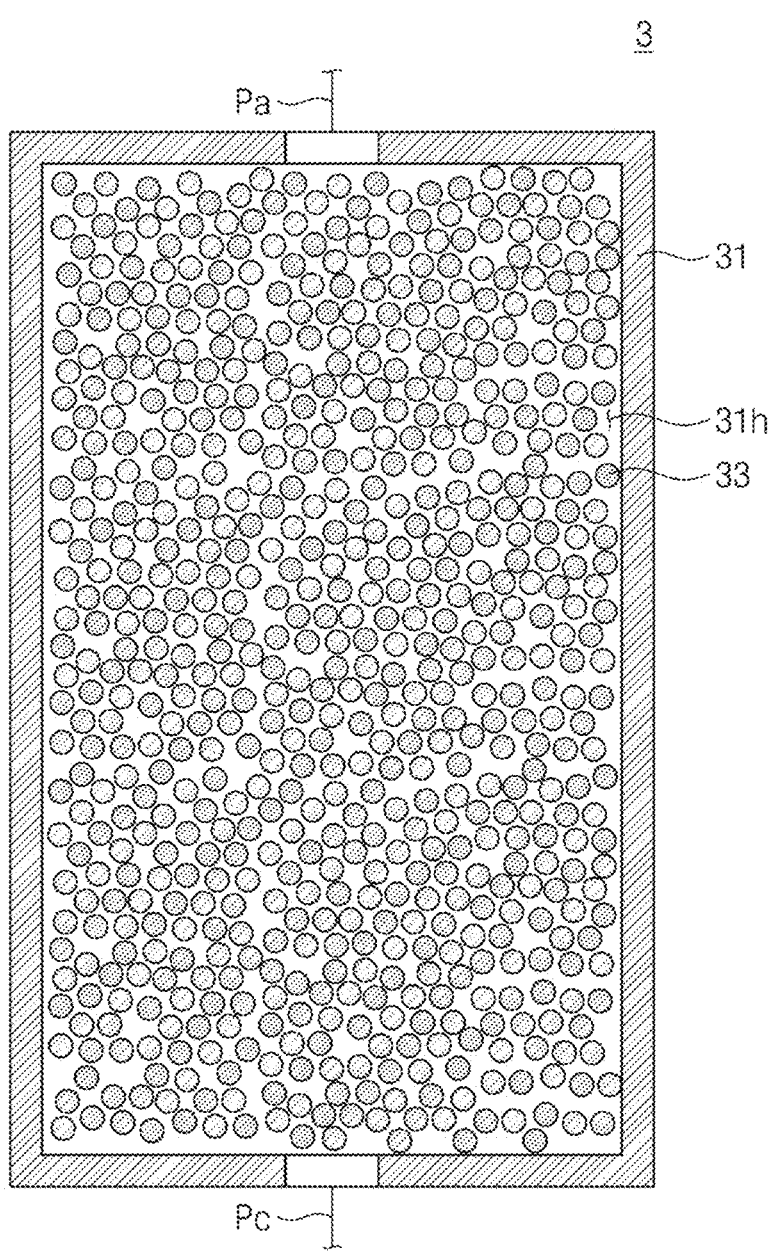
FIG. 4 illustrates a cross-sectional view showing an anion polisher (ANP) according to some embodiments of inventive concepts.
Figure 5:
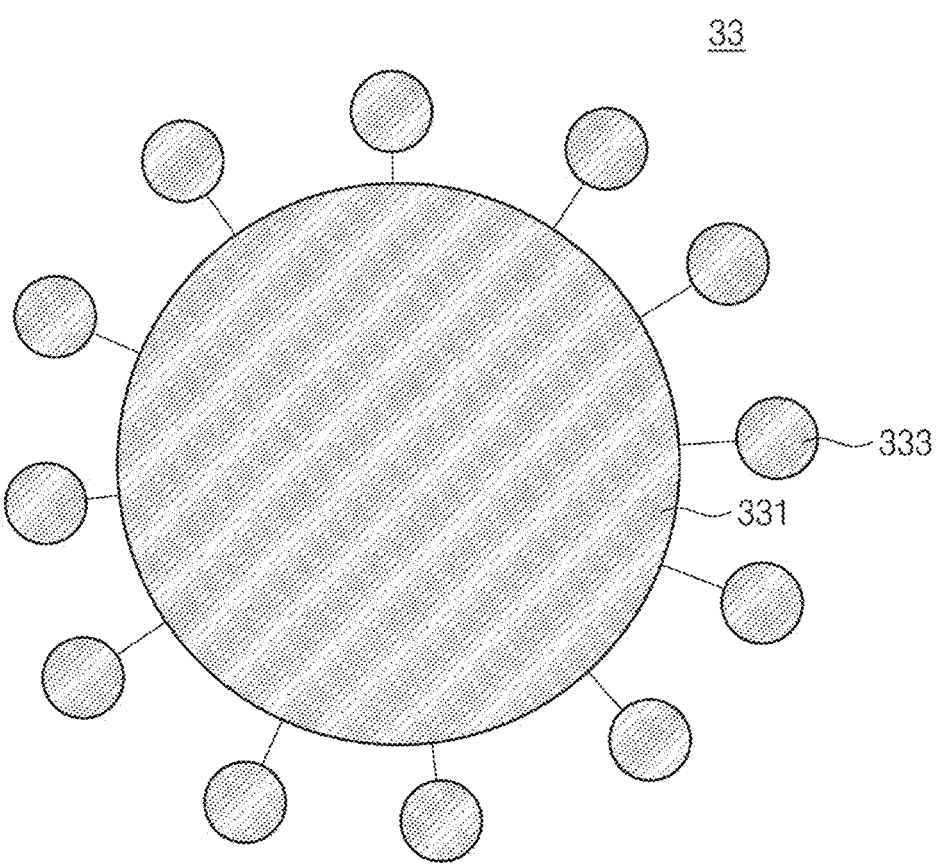
FIG. 5 illustrates a diagram showing a reactant used for ANP according to some embodiments of inventive concepts.

FIG. 4 illustrates a cross-sectional view showing an anion polisher (ANP) according to some embodiments of inventive concepts. FIG. 5 illustrates a diagram showing a reactant used for ANP according to some embodiments of inventive concepts.

Referring to FIG. 4, the ANP 3 may include an ANP tank 31 and a reaction particle 33. The ANP tank 31 may provide a reaction space 31h. The reaction space 31h may be connected to each of the connection line Pa and the second line Pc. The reaction particle 33 may be positioned in the reaction space 31h. The reaction particle 33 may be provided in plural. For convenience, the following will discuss a single reaction particle 33.

Referring to FIG. 5, the reaction particle 33 may include a resin bead 331 and a reactant 333. The reactant 333 may be combined onto a surface of the resin bead 331. A plurality of reactants 333 may be combined with a single resin bead 331. The reactant 333 may include, for example, sulfur trioxide ($SO_3$).

Figure 6:
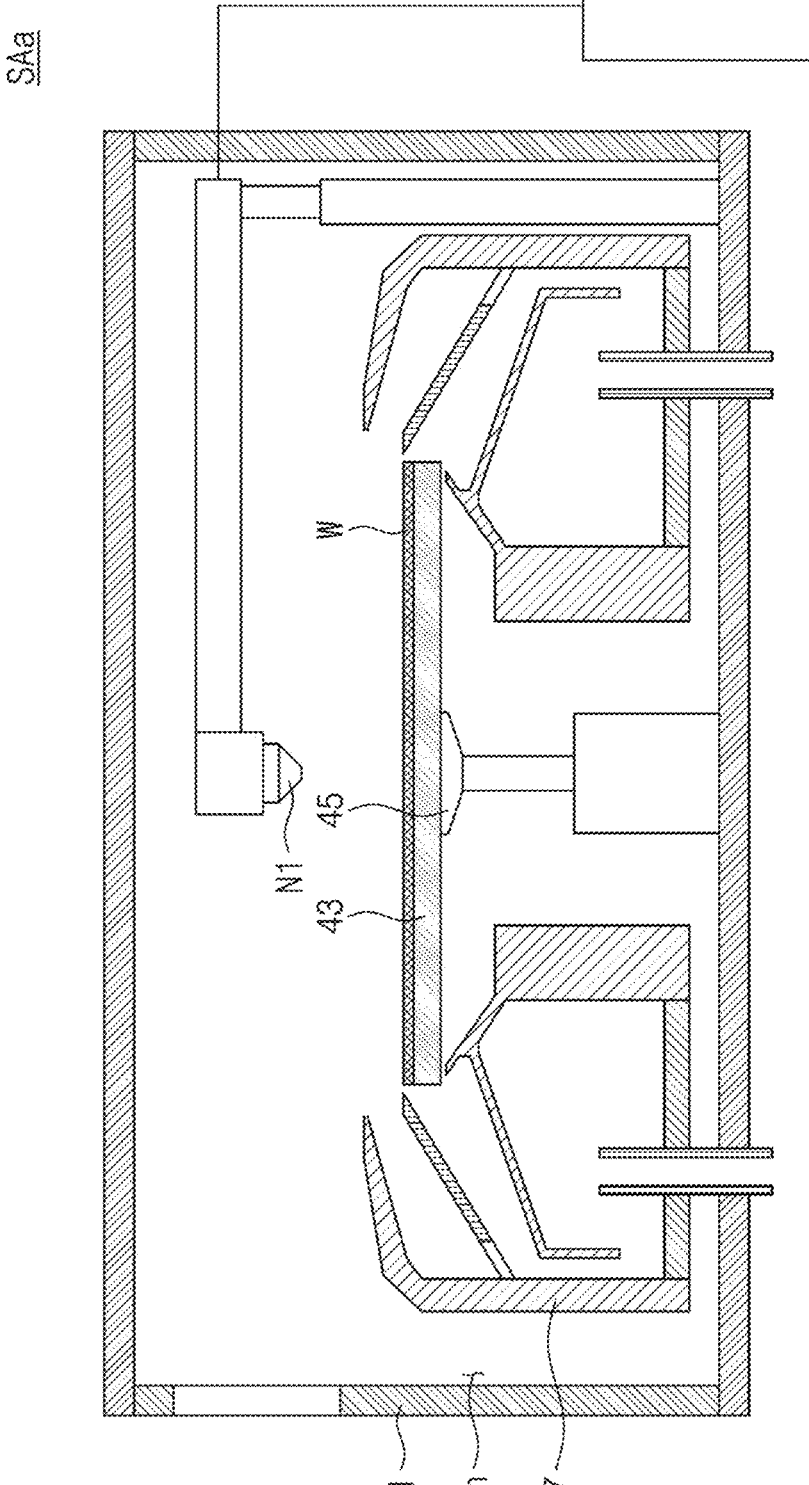
FIG. 6 illustrates a cross-sectional view showing a substrate processing apparatus according to some embodiments of inventive concepts.

FIG. 6 illustrates a cross-sectional view showing a substrate processing apparatus according to some embodiments of inventive concepts.

Referring to FIG. 6, a substrate processing apparatus SAa may be provided. The substrate processing apparatus SAa may perform a cleaning process on a substrate W. For example, the substrate processing apparatus SAa may be a substrate cleaning apparatus. The substrate processing apparatus SAa may include a cleaning chamber 41, a cleaning stage 43, a rotation driver 45, a bowl 47, and a cleaning nozzle N1.

The cleaning chamber 41 may provide a cleaning space 4h. The cleaning stage 43 may be positioned in the cleaning space 41h. The cleaning stage 43 may support the substrate W. The rotation driver 45 (e.g., motor) may rotate the cleaning stage 43. The rotation driver 45 may rotate the substrate W on the cleaning stage 43. The bowl 47 may surround the cleaning stage 43. The cleaning nozzle N1 may be upwardly spaced apart from the cleaning stage 43. The cleaning nozzle N1 may be connected to the ultrapure water production system A. The cleaning nozzle N1 may be supplied with ultrapure water from the ultrapure water production system A. The cleaning nozzle N1 may spray the ultrapure water onto the substrate W on the cleaning stage 43. When the rotation driver 45 rotates the substrate W, the ultrapure water may clean a top surface of the substrate W while being pushed toward an outer portion of the substrate W.

Figure 7:
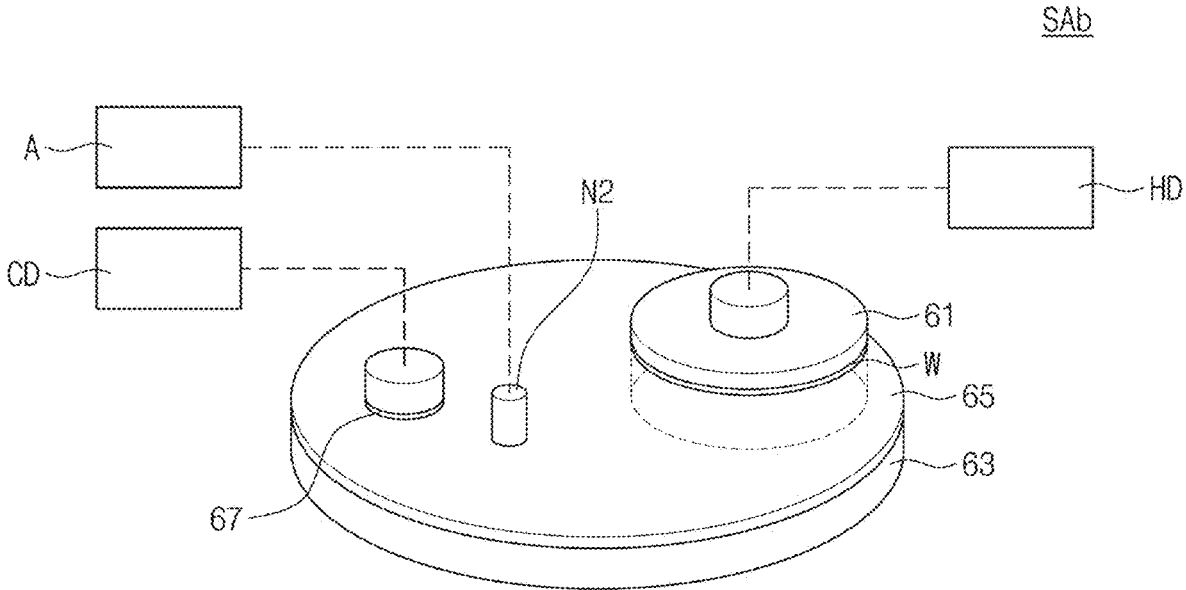
FIG. 7 illustrates a cross-sectional view showing a substrate processing apparatus according to some embodiments of inventive concepts.

FIG. 7 illustrates a cross-sectional view showing a substrate processing apparatus according to some embodiments of inventive concepts.

Referring to FIG. 7, a substrate processing apparatus SAb may be provided. The substrate processing apparatus SAb may perform a polishing process on a substrate W. For example, the substrate processing apparatus SAb may be a chemical mechanical polishing (CMP) apparatus. The substrate processing apparatus SAb may include a polishing head 61, a polishing stage 63, a polishing pad 65, a conditioning disk 67, a head driver HD, a conditioning driver CD, and a polishing nozzle N2.

The polishing head 61 may support the substrate W. The polishing pad 65 may polish the substrate W supported by the polishing head 61. The polishing stage 63 may rotate the polishing pad 65. The polishing pad 65 may polish one surface of the substrate W while being in contact with the substrate W. The conditioning disk 67 may improve a top surface of the polishing pad 65. For example, the conditioning disk 67 may polish the top surface of the polishing pad 65. The head driver HD may drive the polishing head 61 to move rotationally and/or parallel. The conditioning driver CD may drive the conditioning disk 67 to move. The polishing nozzle N2 may be connected to the ultrapure water production system A. The ultrapure water production system A may supply the polishing nozzle N2 with ultrapure water. The polishing nozzle N2 may provide the polishing pad 65 with the ultrapure water supplied from the ultrapure water production system A.

In the description above, the substrate processing apparatus (see SA of FIG. 1) is illustrated as a cleaning apparatus or a polishing apparatus, but inventive concepts are not limited thereto. The substrate processing apparatus SA may include other equipment configured to use ultrapure water to perform a treatment process on a substrate. For example, the substrate processing apparatus SA may include a substrate etching apparatus.

Figure 8:
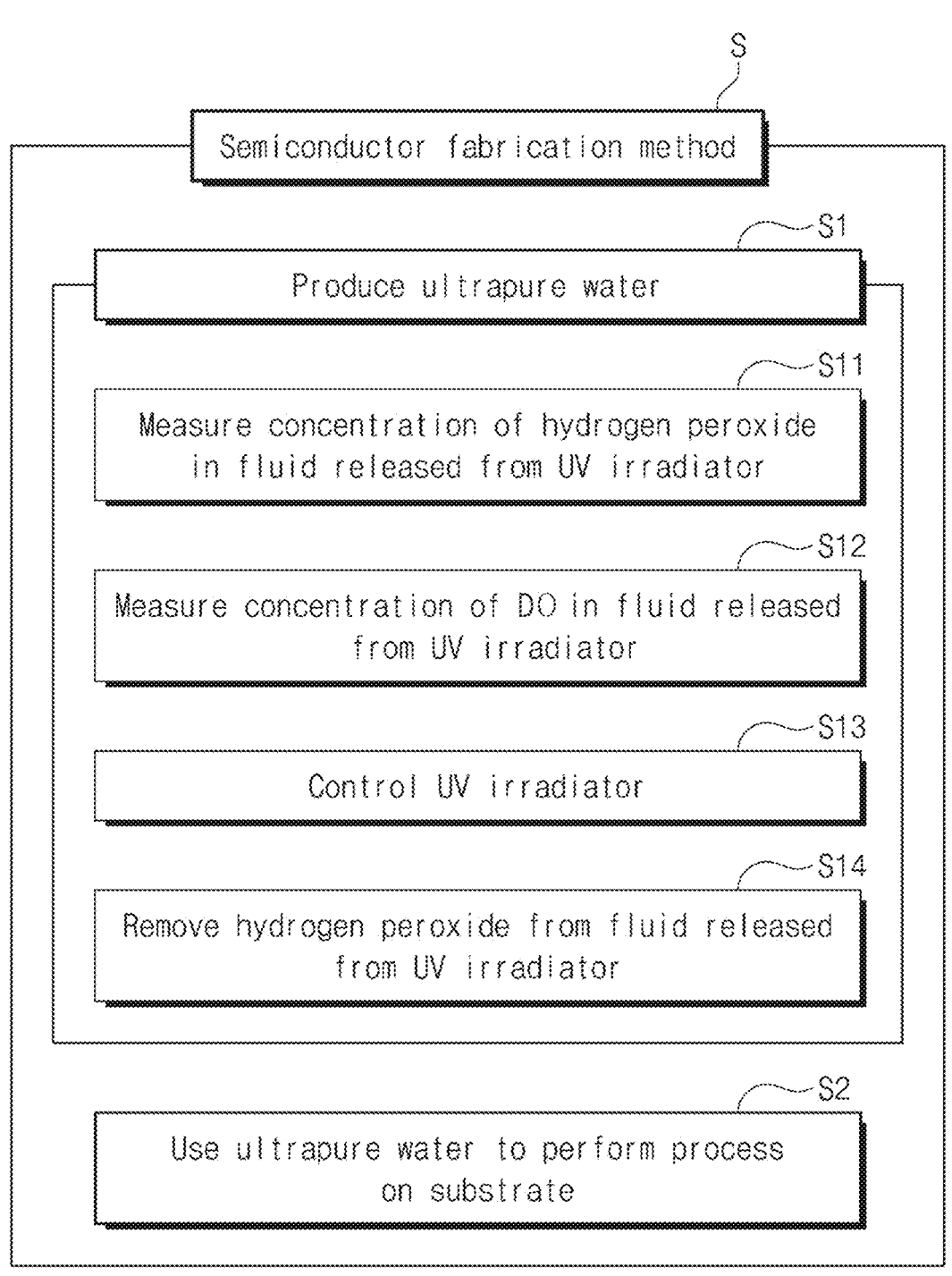
FIG. 8 illustrates a flow chart showing a semiconductor fabrication method according to some embodiments of inventive concepts.

FIG. 8 illustrates a flow chart showing a semiconductor fabrication method according to some embodiments of inventive concepts.

Referring to FIG. 8, a semiconductor fabrication method S may be provided. The semiconductor fabrication method S may be a method of fabricating a semiconductor device by using the semiconductor processing system (see ST of FIG. 1) discussed with reference to FIGS. 1 to 7. The semiconductor fabrication method S may include producing ultrapure water (S1) and using the ultrapure water to perform a process on a substrate (S2).

The ultrapure water production operation (S1) may include measuring a concentration of hydrogen peroxide in fluid that has passed through an ultraviolet (UV) irradiator (S11), measuring a concentration of dissolved oxygen (DO) in the fluid that has passed through the UV irradiator (S12), controlling the UV irradiator (S13), and removing hydrogen peroxide from the fluid that has passed through the UV irradiator (S14).

The substrate process operation S2 may include at least one of (or selected from) polishing a substrate, cleaning the substrate, and etching the substrate.

In the following description, the semiconductor fabrication method S of FIG. 8 will be further discussed in detail with reference to FIGS. 9 to 14.

FIGS. 9 to 14 illustrate diagrams showing a semiconductor fabrication method according to the flow chart of FIG. 8.

Figure 9:
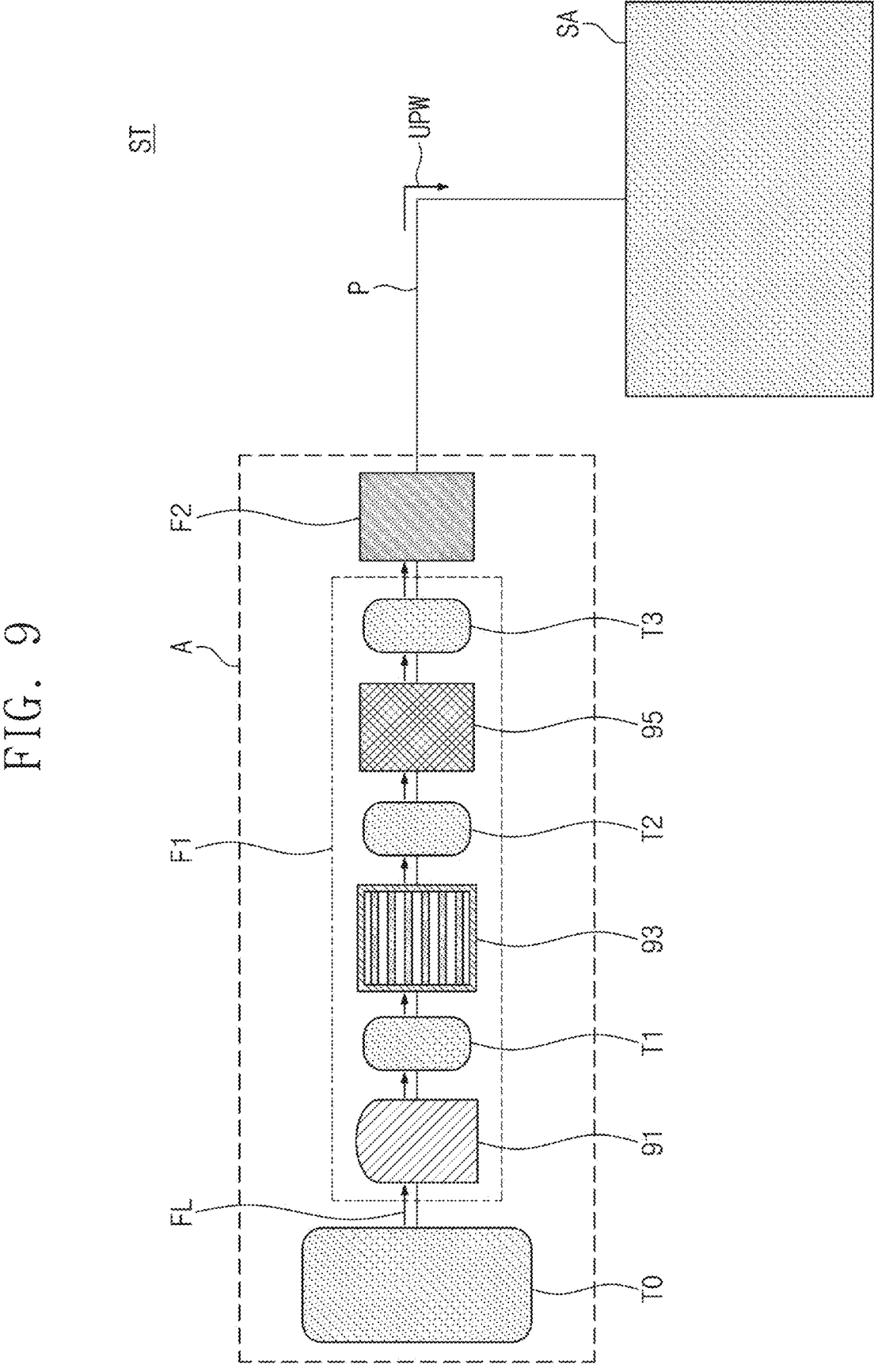

Referring to FIG. 9, the water supply tank TO may supply the front filtering part F1 with fluid FL. The front filtering part F1 may filter the fluid FL. For example, the fluid FL may be filtered through the first filter 91, the first tank T1, the second tank T2, and the third filter 95. The fluid FL temporarily stored in the third tank T3 may move to the rear filtering part F2.

Figure 10:
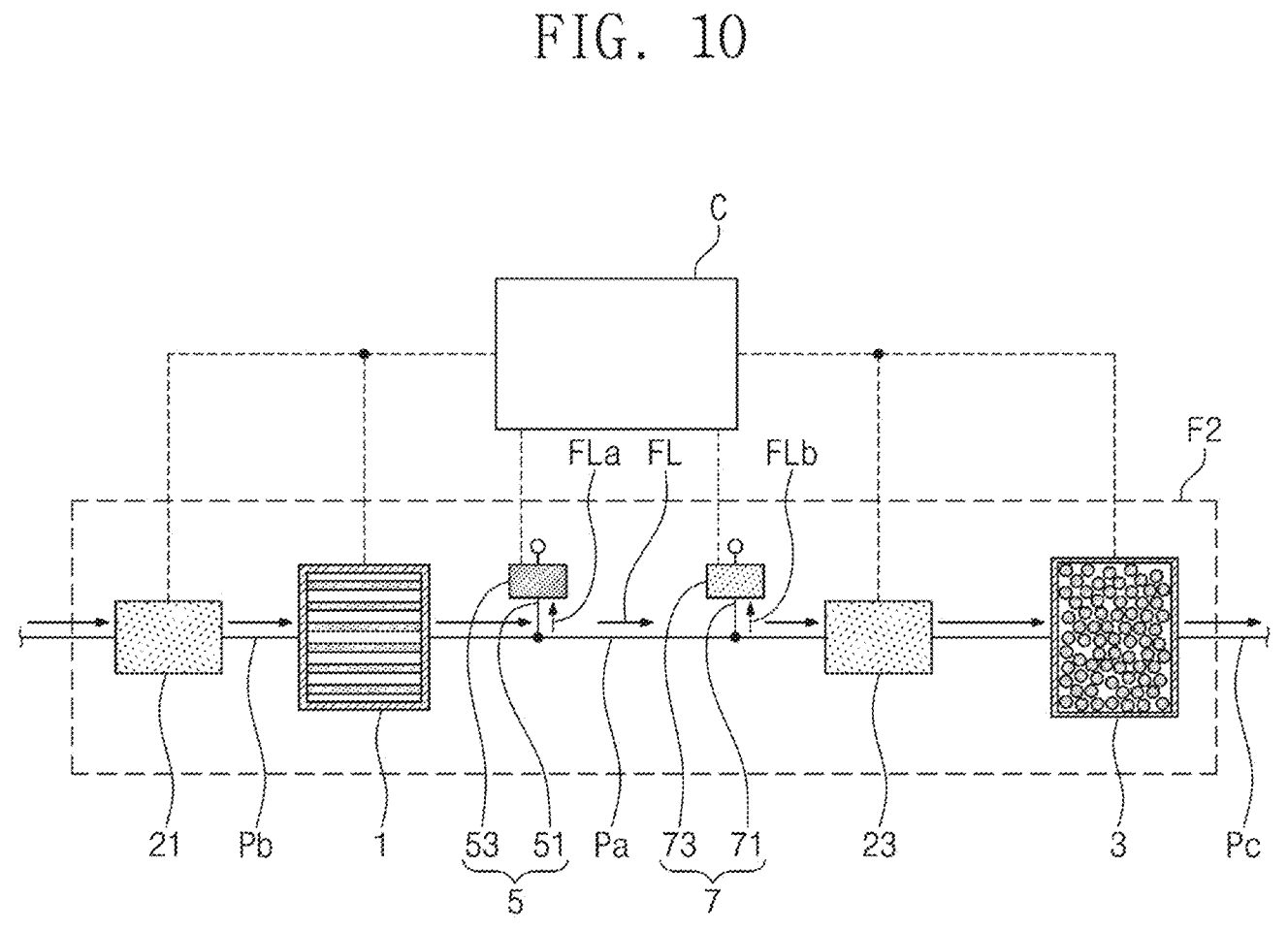

Referring to FIG. 10, the fluid FL may pass through the first TOC analyzer 21. The first TOC analyzer 21 may measure a concentration of total organic carbon in the fluid FL. The controller C may be provided with information about the concentration of total organic carbon in the fluid FL that is measured by the first TOC analyzer 21. The controller C may use the information transferred by the first TOC analyzer 21 to control the UV irradiator 1.

Figure 11:
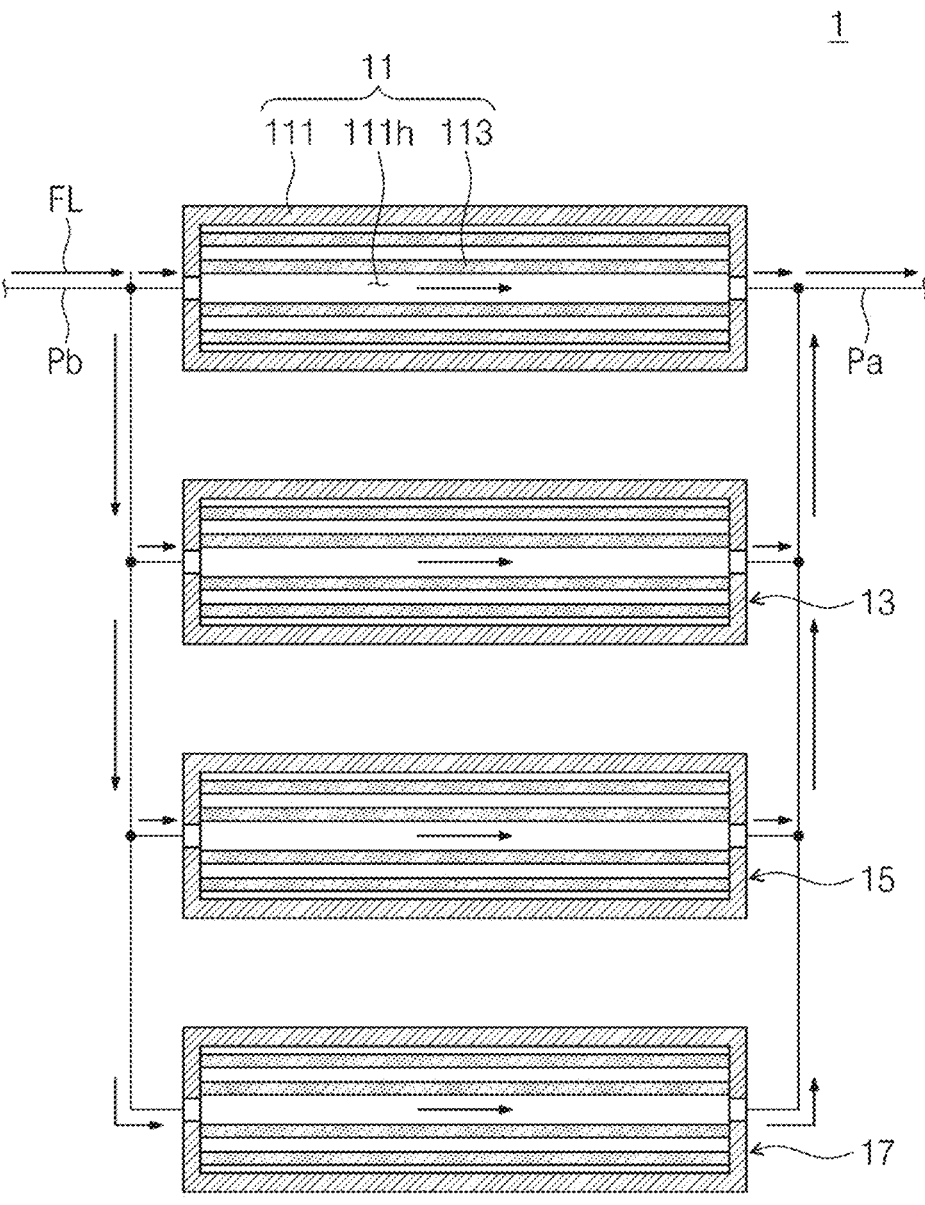

Referring to FIGS. 10 and 11, the UV irradiator 1 may receive the fluid FL that has passed through the first TOC analyzer 21. The UV irradiator 1 may irradiate a UV ray to the fluid FL. In this operation, a plurality of UV lamps 113 may operate to irradiate the UV ray to the fluid FL. For example, four UV lamps 113 may operate in one UV irradiator 1. Thus, an organic material may be removed from the fluid FL.

Referring back to FIGS. 8 and 10, the hydrogen peroxide concentration measurement operation S11 may include allowing the hydrogen peroxide detector 5 to receive at least a portion FLa of the fluid FL that moves along the connection line Pa. The hydrogen peroxide detector 5 may measure a concentration of hydrogen peroxide in the at least a portion FLa of the fluid FL. The controller C may receive information measured by the hydrogen peroxide detector 5.

The DO concentration measurement operation S12 may include allowing the DO detector 7 to receive at least a portion FLb of the fluid FL that moves along the connection line Pa. The DO detector 7 may measure a concentration of dissolved oxygen in the at least a portion FLb of the fluid FL. The controller C may receive information measured by the DO detector 7.

Figure 12:
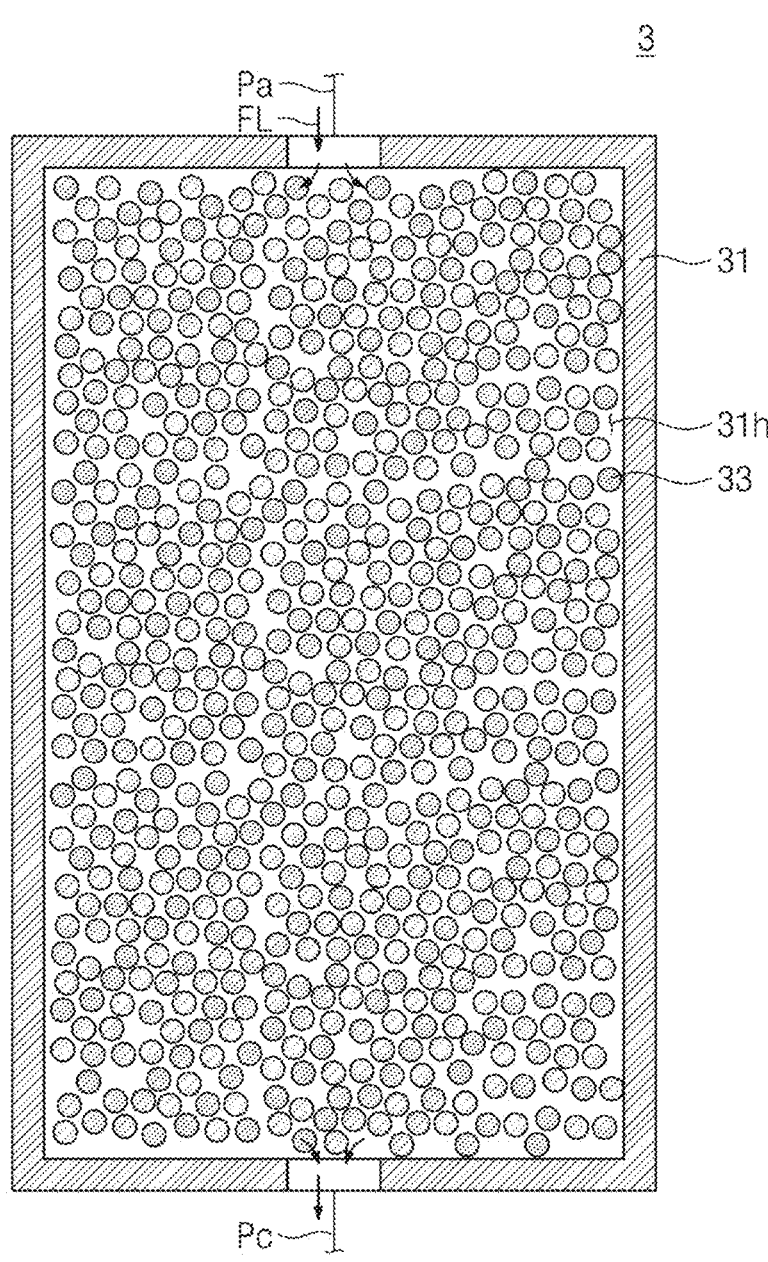

Referring to FIGS. 8 and 12, the hydrogen peroxide removal operation S14 may include allowing hydrogen peroxide in the fluid FL to react with the reaction particle 33. For example, hydrogen peroxide in the fluid FL may react with the reactant (see 333 of FIG. 5). Therefore, hydrogen peroxide may be removed.

In some embodiments, the ultrapure water production operation (see S1 of FIG. 8) may further include measuring a concentration of total organic carbon (TOC) in the fluid FL that has passed through the UV irradiator 1. For example, the second UV irradiator 13 may measure the concentration of TOC in the fluid FL that has passed through the UV irradiator 1. The controller C may receive information measured by the second UV irradiator 13.

Figure 13:
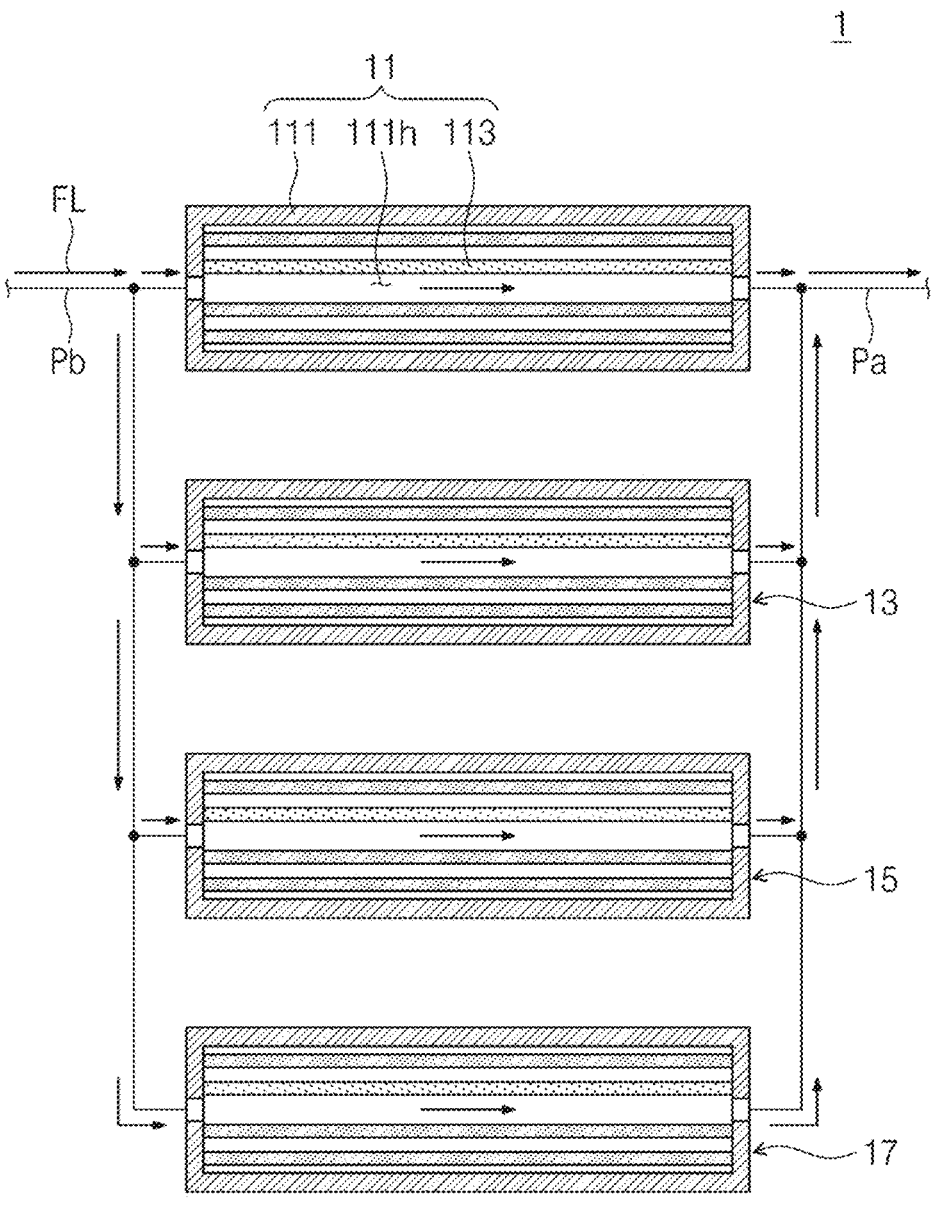
Figure 14:
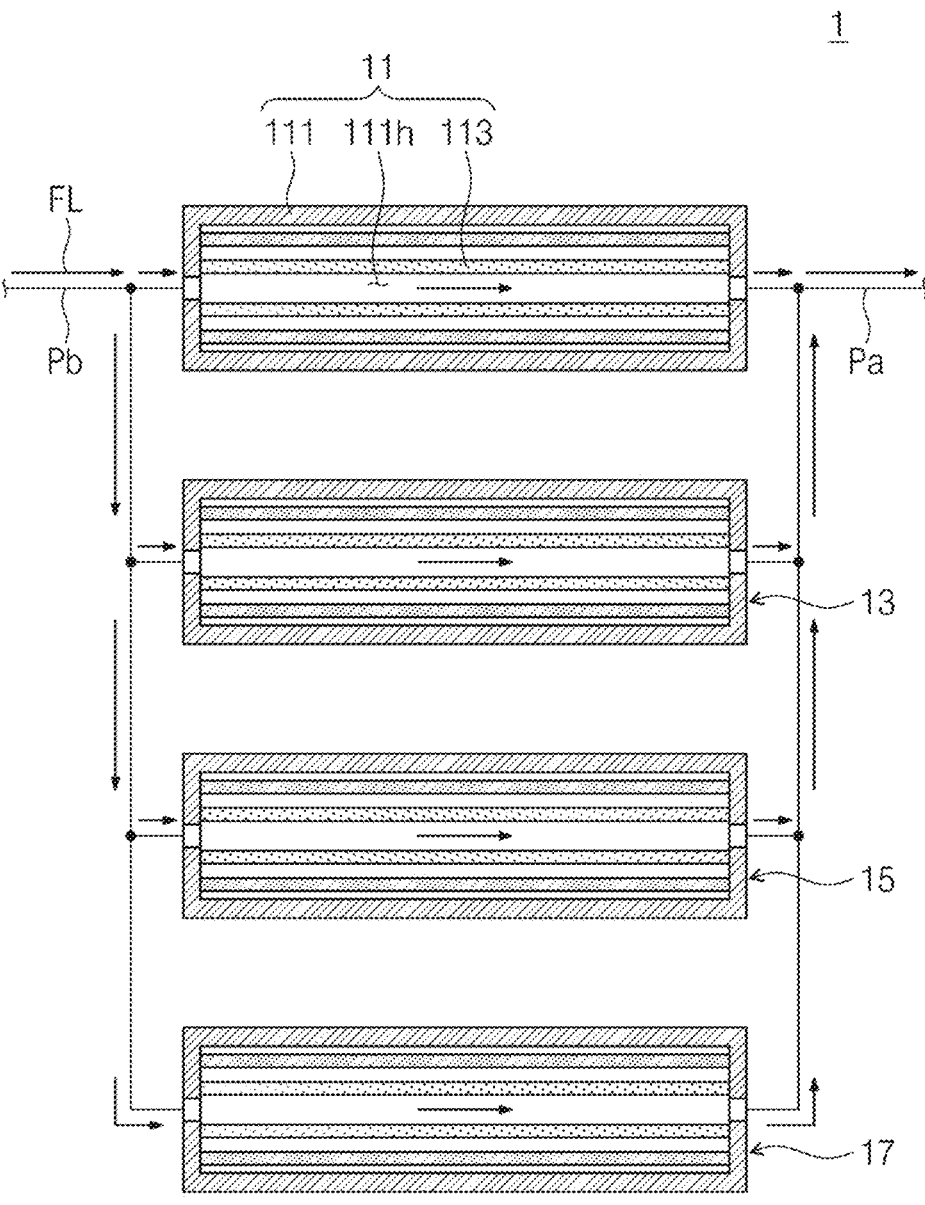

Referring to FIGS. 8, 13, and 14, the UV irradiator control operation S13 may include ascertaining (e.g., detecting) a concentration of TOC in fluid. For example, it may be possible to ascertain whether or not the concentration of TOC in fluid is equal to or less than a first value (e.g., a first threshold). This procedure may be performed by the controller C. The first value may be already input in the controller C. When the concentration of TOC in fluid is equal to or less than the first value, it may not be needed to further operate the plurality of UV lamps 113 in the UV irradiator 1. In contrast, when the concentration of TOC in fluid is greater than the first value, at least one of the plurality of UV lamps 113 in the UV irradiator 1 may more operate. When the concentration of TOC in fluid is greater than the first value, at least one of the plurality of UV lamps 113 in the UV irradiator 1 may further operate irrespective of concentration of hydrogen peroxide in fluid. The concentration of TOC in fluid may decrease when further operating at least one of the plurality of UV lamps 113 in the UV irradiator 1.

The UV irradiator control operation S13 may include ascertaining (e.g., detecting) a concentration of hydrogen peroxide in fluid. For example, it may be possible to ascertain whether or not the concentration of hydrogen peroxide is equal to or greater than a second value. This procedure may be performed by the controller C. The second value (e.g., second threshold) may be already input in the controller C. The second value may range, for example, from about 14 ppb to about 16 ppb. For example, the second value may be about 15 ppb. Inventive concepts, however, are not limited thereto. When the concentration of TOC in fluid is equal to or less than the first value, and simultaneously when the concentration of hydrogen peroxide is equal to or greater than the second value, at least one of the plurality of UV lamps 113 may be interrupted in its operation. Therefore, it may be possible to reduce hydrogen peroxide produced from the UV irradiator 1. In addition, it may be possible to decrease the concentration of hydrogen peroxide in fluid that flows into the ANP (see 3 of FIG. 12). There may be a reduction in amount that the ANP 3 has to treat. Accordingly, the ANP 3 may have a reduced load.

The UV irradiator control operation S13 may include ascertaining (e.g., detecting) a concentration of dissolved oxygen in fluid. For example, it may be possible to ascertain whether or not the concentration of dissolved oxygen in fluid is equal to or greater than a third value. This procedure may be performed by the controller C. The third value may be already input in the controller C. When the concentration of TOC in fluid is equal to or less than the first value, simultaneously when the concentration of hydrogen peroxide is less than the second value, and moreover when the concentration of dissolved oxygen in fluid is equal to or greater than the third value, at least one of the plurality of UV lamps 113 may be interrupted in its operation. Therefore, it may be possible to reduce hydrogen peroxide produced from the UV irradiator 1. In addition, it may be possible to decrease the concentration of hydrogen peroxide in fluid that flows into the ANP (see 3 of FIG. 12). There may be a reduction in amount that the ANP 3 has to treat. Accordingly, the ANP 3 may have a reduced load.

The controller C may determine a part (e.g., UV lamp 113 in the UV irradiator) of the ultrapure water production system A may need maintenance investigation and/or possible replacement if the concentration of TOC in the fluid is greater than the first value after one of the plurality of lamps 113 has operated by irradiating the fluid for a maximum operation time without effectively lowering the concentration of TOC below the first value. Similarly, the controller C may determine another part (e.g., ANP) of the ultrapure water production system A may need maintenance investigation and/or possible replacement if the concentration of hydrogen peroxide in the fluid is greater than or equal to the second value after the ANP has treated the fluid for a maximum operation time without effectively lowering the concentration of hydrogen peroxide below the second value. Similarly, the controller C may determine another part (e.g., ANP) of the ultrapure water production system A may need maintenance investigation and/or possible replacement if the amount of dissolved oxygen measured in the fluid released from the water production system A is greater than or equal to the third value.

According to an ultrapure water production system, a semiconductor processing system including the same, and a semiconductor fabrication method using the same in accordance with some embodiments of inventive concepts, a concentration of hydrogen peroxide and/or a concentration of dissolved oxygen may be measured to control an ultraviolet (UV) lamp. For example, when at least one of hydrogen peroxide and dissolved oxygen has a high concentration, a UV amount may be reduced to decrease the concentration of at least one of hydrogen peroxide and dissolved oxygen. There may be a reduction in amount that an anion polisher (ANP) has to treat. A load applied to the ANP may be reduced, and a replacement cycle of reactants may be increased. The ANP may thus have an increased lifetime. The concentration of at least one of hydrogen peroxide and dissolved oxygen in fluid may be measured in real-time to flexibly cope with situations, and thus it may be possible to increase a lifetime of the ANP while decreasing the concentration of at least one of hydrogen peroxide and dissolved oxygen in fluid.

According to an ultrapure water production system, a semiconductor processing system including the same, and a semiconductor fabrication method using the same in accordance with some embodiments of inventive concepts, hydrogen peroxide and/or dissolved oxygen may be removed to limit and/or prevent damage to a substrate. The substrate may be damaged when the substrate in a substrate processing apparatus is in contact with hydrogen peroxide and/or dissolved oxygen. A hydrogen peroxide detector, a dissolved oxygen (DO) detector, and/or an anion polisher (ANP) may be used to reduce a concentration of at least one of hydrogen peroxide and/or dissolved oxygen, with the result that the substrate may be limited and/or prevented from being in contact with hydrogen peroxide and/or dissolved oxygen. Accordingly, the substrate may increase in manufacturing yield.

According to an ultrapure water production system, a semiconductor processing system including the same, and a semiconductor fabrication method using the same in accordance with inventive concepts, a concentration of hydrogen peroxide may be flexibly controlled.

According to an ultrapure water production system, a semiconductor processing system including the same, and a semiconductor fabrication method using the same in accordance with inventive concepts, an anion polisher may increase in lifetime.

According to an ultrapure water production system, a semiconductor processing system including the same, and a semiconductor fabrication method using the same in accordance with inventive concepts, a substrate may be free of damage.

Effects of inventive concepts are not limited to the mentioned above, other effects which have not been mentioned above will be clearly understood to those skilled in the art from the following description.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although inventive concepts have been described in connection with some embodiments of inventive concepts illustrated in the drawings, it will be understood to those skilled in the art that various changes and modifications may be made without departing from the technical spirit and features of inventive concepts. It therefore will be understood that the embodiments described above are just illustrative and non-limiting in all aspects, with the spirit and scope of inventive concepts being indicated by the claims.

What is claimed is:

1. An ultrapure water production system, comprising:
a front filtering part configured to filter a fluid; and
a rear filtering part configured to filter the fluid after the fluid is released from the front filtering part, wherein
the rear filtering part includes
an ultraviolet (UV) irradiator configured to irradiate a UV ray onto the fluid to remove an organic material from the fluid;
an anion polisher (ANP) configured to remove hydrogen peroxide from the fluid after the fluid is released from the UV irradiator;
a connection line that connects the UV irradiator to the ANP, the connection line being in fluid communication with UV irradiator and the ANP;
a hydrogen peroxide detector on the connection line and configured to detect a concentration of hydrogen peroxide in the fluid after the fluid is released from the UV irradiator; and
a dissolved oxygen (DO) detector on the connection line between the hydrogen peroxide detector and the ANP, the DO detector being configured to measure a concentration of dissolved oxygen in the fluid after the fluid is released from the UV irradiator.

2. The ultrapure water production system of claim 1, wherein
the ANP includes an ANP tank providing a reaction space and a plurality of particles in the reaction space,
the ANP tank is connected to the connection line and in fluid communication with the connection line, and
each of the plurality of particles includes a resin bead and a reactant on a surface of the resin bead.

3. The ultrapure water production system of claim 2, wherein the reactant includes sulfur trioxide ($SO_3$).

4. The ultrapure water production system of claim 1, wherein
the UV irradiator includes a UV tank providing a UV irradiation space and a plurality of UV lamps in the UV irradiation space, and
the UV tank is connected to the connection line and in fluid communication with the connection line.

5. The ultrapure water production system of claim 1, wherein
the hydrogen peroxide detector includes a first detection line and a hydrogen peroxide sensor connected to an end of the first detection line,
the first detection line is branched from the connection line and in fluid communication with the connection line, and
the hydrogen peroxide sensor is configured to detect a concentration of hydrogen peroxide in the fluid after the fluid is released from the first detection line.

6. The ultrapure water production system of claim 1, wherein
the DO detector includes a second detection line and a dissolved oxygen (DO) sensor,
the second detection line is branched from the connection line and in fluid communication with the connection line, and
the dissolved oxygen (DO) sensor that is connected to an end of the second detection line and configured to detects a concentration of dissolved oxygen in the fluid after the fluid is released from the second detection line.

7. The ultrapure water production system of claim 1, wherein the rear filtering part further includes a total organic carbon (TOC) analyzer between the front filtering part and the UV irradiator.

8. The ultrapure water production system of claim 1, further comprising:
a controller configured to control an operation of at least one of the UV irradiator or the ANP based on information received from at least one of the hydrogen peroxide detector or the DO detector.

9. A semiconductor processing system, comprising:
the ultrapure water production system of claim 1, the ultrapure water production system being configured to produce ultrapure water; and
a substrate processing apparatus arranged to be supplied with the ultrapure water from the ultrapure water production system, the substrate processing apparatus configured to perform a process on a substrate.

10. The semiconductor processing system of claim 9, wherein the substrate processing apparatus includes one of a chemical mechanical polishing (CMP) apparatus, a substrate cleaning apparatus, and a substrate etching apparatus.

11. The semiconductor processing system of claim 9, wherein the front filtering part includes an active carbon filter, a front UV irradiator, an ion exchange resin device, and a vacuum degassing device.

12. The semiconductor processing system of claim 11, wherein the UV irradiator is configured to irradiate the fluid with UV radiation in a range of about 180 nm to about 190 nm, and the front UV irradiator is configured to irradiate the fluid with a UV ray having a different wavelength from a wavelength of the UV radiation from the UV irradiator.

13. The semiconductor processing system of claim 9, wherein the ANP includes an ANP tank providing a reaction space and a plurality of particles in the reaction space.

14. A semiconductor fabrication method, comprising:

producing ultrapure water using the ultrapure water production system of claim 1; and performing a process on a substrate using the ultrapure water, wherein the producing the ultrapure water includes using the hydrogen peroxide detector to measure the concentration of hydrogen peroxide in the fluid released from the UV irradiator, controlling the UV irradiator based on information about the concentration of hydrogen peroxide measured by the hydrogen peroxide detector; and using the ANP to remove hydrogen peroxide from the fluid released from the UV irradiator.

15. The semiconductor fabrication method of claim 14, wherein the UV irradiator includes a plurality of UV lamps, the producing the ultrapure water further includes measuring a concentration of total organic carbon (TOC) in the fluid released from the UV irradiator, the controlling the UV irradiator includes detecting whether the concentration of TOC in the fluid is equal to or less than a first value, detecting whether the concentration of hydrogen peroxide is equal to or greater than a second value; and stopping an operation of at least one operating UV lamp among the plurality of UV lamps in response to the concentration of TOC in the fluid being equal to or less than the first value, the concentration of hydrogen peroxide in the fluid being equal to or greater than the second value, or both the concentration of TOC in the fluid being equal to or less than the first value and the concentration of hydrogen peroxide in the fluid being equal to or greater than the second value.

16. The semiconductor fabrication method of claim 15, wherein the controlling the UV irradiator further includes operating at least one more UV lamp among the plurality of UV lamps, in response to the concentration of TOC in the fluid being greater than the first value and irrespective of the concentration of hydrogen peroxide in the fluid.

17. The semiconductor fabrication method of claim 15, wherein the producing the ultrapure water further includes using the dissolved oxygen (DO) detector to measure the concentration of DO in the fluid after the fluid is released from the UV irradiator, the DO detector is between the UV irradiator and the ANP.

18. The semiconductor fabrication method of claim 17, wherein the controlling the UV irradiator includes stopping an operation of at least one operating UV lamp among the plurality of UV lamps in response to at least one of the concentration of TOC in the fluid being equal to or less than the first value, the concentration of hydrogen peroxide being less than the second value, and the concentration of DO in the fluid being equal to or greater than a third value.

19. The semiconductor fabrication method of claim 14, wherein performing the process on the substrate includes one or more of:

polishing the substrate;

cleaning the substrate; and etching the substrate.

* * * * *